(12) United States Patent
Wirbeleit et al.

(10) Patent No.: US 7,442,971 B2
(45) Date of Patent: Oct. 28, 2008

(54) SELF-BIASING TRANSISTOR STRUCTURE AND AN SRAM CELL HAVING LESS THAN SIX TRANSISTORS

(75) Inventors: Frank Wirbeleit, Freiberg (DE); Manfred Horstmann, Duerrroehrsdorf-Dittersbach (DE); Christian Hobert, Pirna (DE)

(73) Assignee: Advanced Micro Devices, Inc., Austin, TX (US)

( * ) Notice: Subject to any disclaimer, the term of this patent is extended or adjusted under 35 U.S.C. 154(b) by 274 days.

(21) Appl. No.: 11/045,177

(22) Filed: Jan. 28, 2005

(65) Prior Publication Data

US 2006/0022282 A1 Feb. 2, 2006

(30) Foreign Application Priority Data

Jul. 30, 2004 (DE) .................. 10 2004 037 087

(51) Int. Cl.
*H01L 31/112* (2006.01)
(52) U.S. Cl. .................. 257/287; 257/241; 257/329; 257/402; 257/403; 438/289
(58) Field of Classification Search .................. 257/607, 257/408, 403, 344, 402, 241, 274, 287, 329; 438/289
See application file for complete search history.

(56) References Cited

U.S. PATENT DOCUMENTS

| 4,021,835 | A | 5/1977 | Etoh et al. .................. 357/23 |
| 4,145,233 | A | 3/1979 | Sefick et al. .................. 148/1.5 |
| 4,276,095 | A | 6/1981 | Beilstein, Jr. et al. ........ 148/1.5 |
| 4,350,991 | A | 9/1982 | Johnson et al. ................ 357/23 |
| 4,819,043 | A | 4/1989 | Yazawa et al. ............. 357/23.3 |
| 5,672,536 | A | 9/1997 | Wu et al. ....................... 437/52 |
| 6,245,607 | B1 | 6/2001 | Tang et al. .................. 438/217 |
| 6,898,096 | B2 * | 5/2005 | Endo et al. .................. 363/147 |
| 7,005,350 | B2 * | 2/2006 | Walker et al. ............... 438/268 |
| 2002/0041003 | A1 | 4/2002 | Udrea et al. ................. 257/502 |
| 2002/0163021 | A1 | 11/2002 | Robb et al. .................. 257/273 |
| 2002/0179946 | A1 | 12/2002 | Hara et al. ................... 257/288 |
| 2003/0048657 | A1 | 3/2003 | Forbes ......................... 365/154 |
| 2004/0145399 | A1 * | 7/2004 | Bhattacharyya ............. 327/278 |

FOREIGN PATENT DOCUMENTS

| DE | 692 31 030 T2 | 12/1992 |
| DE | 102 45 575 A1 | 4/2004 |
| DE | 102 52 882 A1 | 6/2004 |
| EP | 0 774 785 A2 | 5/1997 |

* cited by examiner

*Primary Examiner*—Phuc T Dang
*Assistant Examiner*—Thanh Y Tran
(74) *Attorney, Agent, or Firm*—Williams, Morgan & Amerson, P.C.

(57) ABSTRACT

By providing a self-biasing semiconductor switch, an SRAM cell having a reduced number of individual active components may be realized. In particular embodiments, the self-biasing semiconductor device may be provided in the form of a double channel field effect transistor that allows the formation of an SRAM cell with less than six transistor elements and, in preferred embodiments, with as few as two individual transistor elements.

25 Claims, 6 Drawing Sheets

SELF-BIASING TRANSISTOR STRUCTURE AND AN SRAM CELL HAVING LESS THAN SIX TRANSISTORS

BACKGROUND OF THE INVENTION

1. Field of the Invention

The present invention generally relates to the fabrication of integrated circuits, and, more particularly, to transistor architectures that enable an extended functionality of transistor devices, thereby providing the potential for simplifying the configuration of circuit elements, such as registers, static RAM cells, and the like.

2. Description of the Related Art

In modern integrated circuits, such as microprocessors, storage devices, and the like, a huge number of circuit elements, especially transistors, are provided and operated on a restricted chip area. Although immense progress has been made over the recent decades with respect to increased performance and reduced feature sizes of the circuit elements, the ongoing demand for enhanced functionality of electronic devices forces semiconductor manufacturers to steadily reduce the dimensions of the circuit elements and to increase the operating speed thereof. However, the continuing scaling of feature sizes involves great efforts in redesigning process techniques and developing new process strategies and tools to comply with new design rules. Generally, in complex circuitry including complex logic portions, the MOS technology is presently a preferred manufacturing technique in view of device performance and/or power consumption. In integrated circuits including logic portions formed by the MOS technology, a large number of field effect transistors (FETs) are provided that are typically operated in a switched mode, that is, these devices exhibit a highly conductive state (on-state) and a high impedance state (off-state). The state of the field effect transistor is controlled by a gate electrode, which may influence, upon application of an appropriate control voltage, the conductivity of a channel region formed between a drain terminal and a source terminal.

Figure 1A:
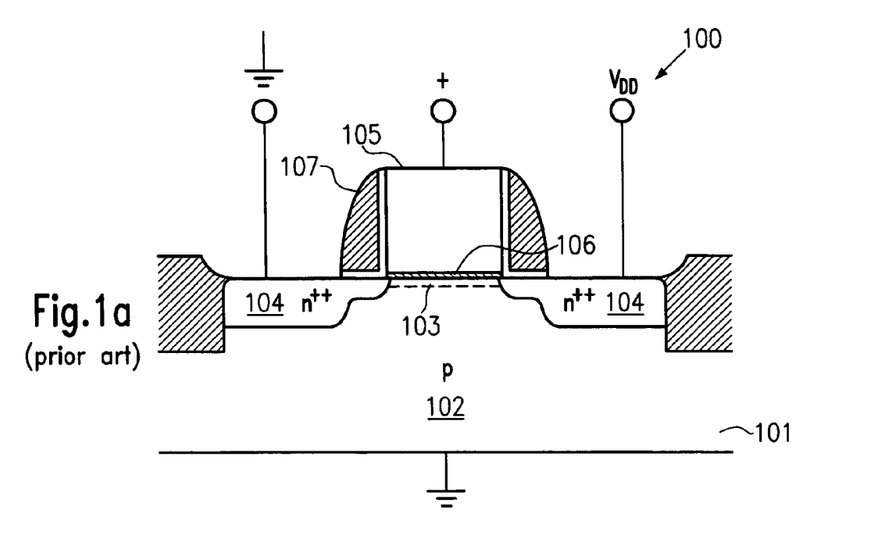
FIG. 1a schematically shows a cross-sectional view of a typical conventional field effect transistor.

FIG. 1a schematically shows a cross-sectional view of a typical field effect transistor element as may be used in modern MOS-based logic circuitry. A transistor element 100 comprises a substrate 101, for instance a silicon substrate having formed thereon or therein a crystalline region 102 on and in which further components of the transistor element 100 are formed. The substrate 101 may also represent an insulating substrate having formed thereon a crystalline semiconductor layer of specified thickness that accommodates further components of the transistor 100. The crystalline region 102 comprises two or more different dopant materials in a varying concentration to obtain the desired transistor function. To this end, highly doped drain and source regions 104 defining a first conductivity type, for instance, an N-conductivity, are formed within the crystalline region 102 and have a specified lateral and vertical dopant profile. On the other hand, the crystalline region 102 between the drain and source regions 104 may be doped with a material providing the opposite conduc- trinity type, that is, as in the example shown, a P-conductivity, to produce a PN junction with each of the drain and source regions 104. Moreover, a relatively thin channel region 103 may be established between the drain and source regions 104 and it may be doped with a P-type material when the transistor 100 is to represent an N-channel enhancement transistor, or which may be slightly doped with an N-type material when the transistor 100 is to represent an N-channel depletion transistor. Formed above the channel region 103 is a gate electrode 105, which is separated and thus electrically insulated from the channel region 103 by a thin gate insulation layer 106. In a typical modern transistor element, sidewall spacers 107 may be provided at sidewalls at the gate electrode 105, which may be used during the formation of the drain and source regions 104 by ion implantation and/or in subsequent processes for enhancing the conductivity of the gate electrode 105, which is typically comprised of doped polysilicon in silicon-based transistor elements. For convenience, any further components such as metal silicates and the like are not shown in FIG. 1a.

As previously mentioned, an appropriate manufacturing process involves a plurality of highly complex process techniques, which depend on the specified design rules that prescribe the critical dimensions of the transistor element 100 and respective process margins. For example, one essential dimension of the transistor 100 is the channel length, i.e., in FIG. 1a, the horizontal extension of the channel region 103, wherein the channel length is substantially determined by the dimension of the gate electrode 105 since the gate electrode 105, possibly in combination with any sidewall spacers, such as the spacers 107, is used as an implantation mask during the formation of the drain and source regions 104. As critical dimensions of advanced transistor elements are presently at approximately 50 nm and even less, any further progress in enhancing performance of integrated circuits entails great effort in adapting established process techniques and in developing new process techniques and process tools. Irrespective of the actual dimensions of the transistor element 100, the basic operations scheme is as follows. During operation, the drain and source regions 104 are connected to respective voltages, such as ground and supply voltage VDD, wherein it is now assumed that the channel region 103 is slightly P-doped to provide the functionality of an N-channel enhancement transistor. It is further assumed that the left region 104 is connected to ground and will thus be referred to as the source region, even though, in principle, the transistor architecture shown in FIG. 1a is symmetric with respect to the regions 104. Hence, the region 104 on the right-hand side, connected to VDD, will be referred to as the drain region. Moreover, the crystalline region 102 is also connected to a specified potential, which may be ground potential and any voltages referred to in the following are considered as voltages with respect to the ground potential supplied to the crystalline region 102 and the source region 104. Without a voltage supplied to the gate electrode 105 or with a negative voltage, the conductivity of the channel region 103 remains extremely low, since at least the PN junction from the channel region 103 to the drain region 104 is inversely biased and only a negligible number of minority charge carriers is present in the channel region 103. Upon increasing the voltage supplied to the gate electrode 105, the number of minority charge carriers, i.e., electrons, in the channel region 103 may be increased due the capacitive coupling of the gate potential to the channel region 103, but without significantly increasing the total conductivity of the channel region 103, as the PN junction is still not sufficiently forward-biased. Upon further increasing the gate voltage, the channel conductivity abruptly increases, as the number of minority charge carriers is increased to remove the space charge area in the PN junction, thereby forward-biasing the PN junction so that electrons may flow from the source region to the drain region. The gate voltage at which the abrupt conductivity change of the channel region 103 occurs is referred to as threshold voltage VT.

Figure 1B:
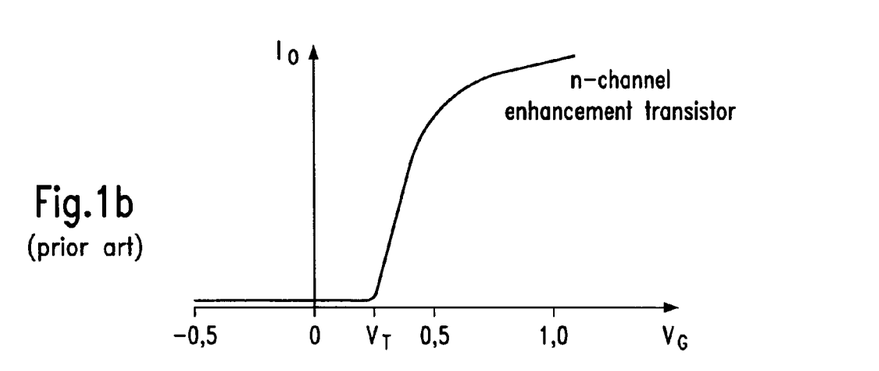
FIG. 1b and FIG. 1c schematically show plots of the progression of the drain current, i.e., the progression of the channel conductivity, versus the applied gate voltage for an N-channel enhancement transistor and for an N-channel depletion transistor, respectively.

FIG. 1b qualitatively illustrates the behavior of the device 100 when representing an N-channel enhancement transistor. The gate voltage VG is plotted on the horizontal axis, while the vertical axis represents the current, that is the electrons, flowing from the source region to the drain region via the channel region 103. It should be appreciated that the drain current depends on the applied voltage VDD and the specifics of the transistor 100. At any rate, the drain current may represent the behavior of the channel conductivity, which may be controlled by gate voltage VG. In particular, a high impedance state and a high conductivity state are defined by the threshold voltage VT.

Figure 1C:
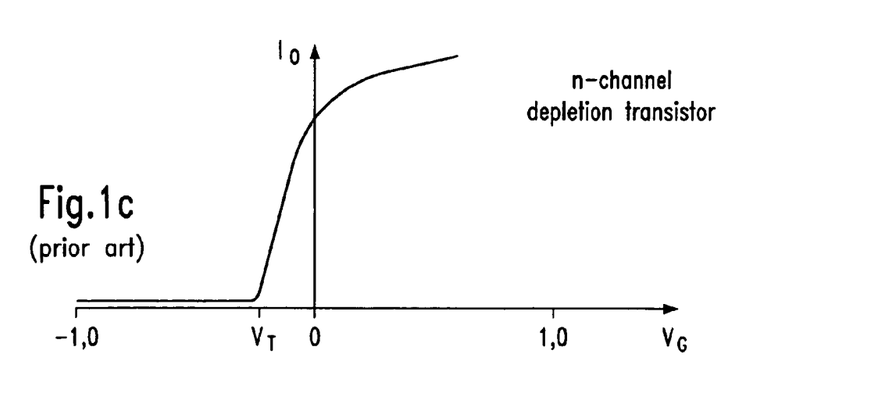

FIG. 1c schematically shows the behavior of the transistor element 100 when provided in the form of an N-channel depletion transistor, i.e., when the channel region 103 is slightly N-doped. In this case, the majority charge carriers (electrons) provide for conductivity of the channel region 103 for a zero gate voltage, and even for a negative gate voltage, unless the negative gate voltage is sufficiently high to create sufficient minority charge carriers to establish an inversely biased PN junction, thereby abruptly decreasing the channel conductivity. The threshold voltage VT is shifted to negative gate voltages in the N-channel depletion transistor when compared with the behavior of the N-channel enhance- ment transistor.

It should be noted that a similar behavior is obtained for P-channel enhancement and depletion transistors, wherein, however, the channel conductivity is high for negative gate voltages and abruptly decreases at the respective threshold voltages with a further increasing gate voltage.

On the basis of field effect transistors, such as the transistor element 100, more complex circuit components may be created. For instance, storage elements in the form of registers, static RAM (random access memory), and dynamic RAM represent an important component of complex logic circuitries. For example, during the operation of complex CPU cores, a large amount of data has to be temporarily stored and retrieved, wherein the operating speed and the capacity of the storage elements significantly influence the overall performance of the CPU. Depending on the memory hierarchy used in a complex integrated circuit, different types of memory elements are used. For instance, registers and static RAM cells are typically used in the CPU core due to their superior access time, while dynamic RAM elements are preferably used as working memory due to the increased bit density compared to registers or static RAM cells. Typically, a dynamic RAM cell comprises a storage capacitor and a single transistor, wherein, however, a complex memory management system is required to periodically refresh the charge stored in the storage capacitors, which may otherwise be lost due to unavoidable leakage currents. Although the bit density of DRAM devices may be extremely high, a charge has to be transferred from and to storage capacitors in combination with periodic refresh pulses, thereby rendering these devices less efficient in terms of speed and power consumption when compared to static RAM cells. On the other hand, static RAM cells require a plurality of transistor elements to allow the storage of an information bit.

Figure 1D:
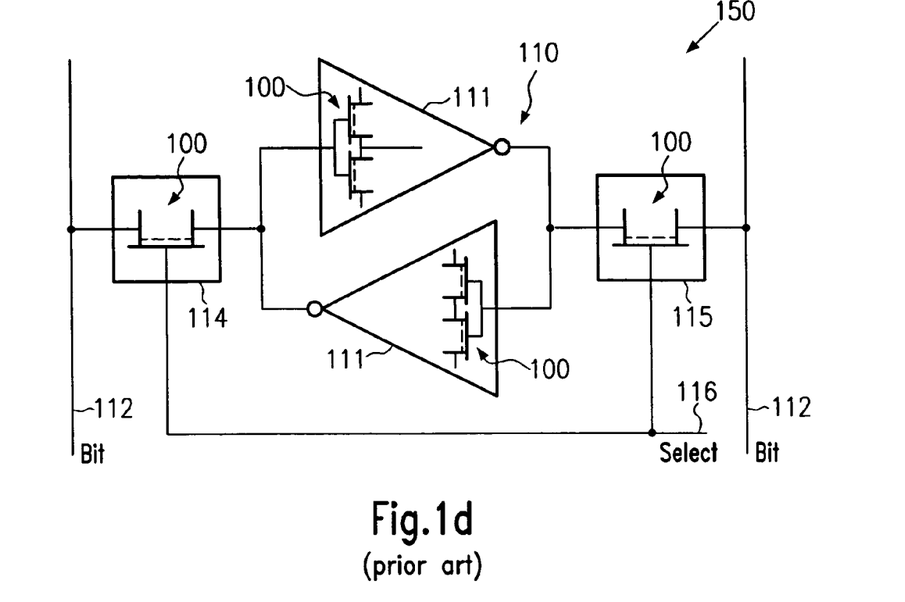
FIG. 1d schematically shows a circuit diagram of a typical conventional static RAM cell including at least six individual transistor elements.

FIG. 1d schematically shows a sketch of a static RAM cell 150 in a configuration as may typically be used in modern integrated circuits. The cell 150 comprises a bit cell 110 including, for instance, two inversely coupled inverters 111. The bit cell 110 may be connectable to a bit line 112 and to an inverse bit line 113 (not shown in FIG. 1d) by respective select transistor elements 114, 115. The bit cell 110, that is, the inverters 111, as well as the select transistor elements 114, 115, may be formed of transistor elements, such as the transistor 100 shown in FIG. 1a. For example, the inverters 111 may each comprise a complementary pair of transistors 100, that is, one P-channel enhancement transistor and one N-channel enhancement transistor coupled as shown in FIG. 1d. Likewise, the select transistor elements 114, 115 may be comprised of N-channel enhancement transistors 100.

During operation of the RAM cell 150, the bit cell 110 may be "programmed" by pre-charging the bit lines 112, 113, for example with logic high and logic zero, respectively, and by activating the select line 116, thereby connecting the bit cell 110 with the bit lines 112, 113. After deactivating the select line 116, the state of the bit cell 110 is maintained as long as the supply voltage is connected to the cell 150 or as long as a new write cycle is performed. The state of the bit cell 110 may be retrieved by, for example, bringing the bit lines 112, 113 in a high impedance state and activating the select line 116.

As is evident from FIG. 1d, high operating speeds are achievable with the cell 150 due to the absence of storage capacitors, and a simplified management in reading and writing the bit cell 110 is provided since any synchronization with refresh pulses is not necessary. On the other hand, at least six individual transistor elements 100 are required for storing an information bit, thereby rendering the architecture of the cell 150 less space efficient. Hence, frequently a trade-off has to be made with respect to bit density in relation to speed and performance requirements.

In view of the problems identified above, a need exists for an improved device architecture that enables the formation of storage elements in a more space efficient manner.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of circuit components including transistor elements in a more space-efficient manner, especially in static memory devices, in that the functionality of a transistor element is extended so that a self-biasing conductive state may be obtained.

According to one illustrative embodiment of the present invention, a semiconductor device comprises a drain region formed in a substantially crystalline semiconductor material and doped with a first type of dopant material to provide a first conductivity type. The device further comprises a source region formed in the substantially crystalline semiconductor material, which is doped with the first type of dopant material to provide the first conductivity type. A first channel region is located between the drain region and the source region and is doped with the first type of dopant material to provide the first conductivity type. Furthermore, a second channel region is located between the drain region and the source region and adjacent to the first channel region and is doped with a second type of dopant material to provide a second conductivity type that differs from the first conductivity type. Finally, a gate electrode is located to enable control of the first and second channel regions.

In accordance with another illustrative embodiment of the present invention, a transistor element comprises a drain region, a source region, and a channel region, which is formed between the drain region and the source region and which is configured to define at least a first threshold of a first abrupt conductivity change and a second threshold of a second abrupt conductivity change of the channel region. The transistor element further comprises a gate electrode that is located to enable control of the channel region by capacitive coupling.

According to yet another illustrative embodiment of the present invention, a static RAM cell comprises a select transistor and an information storage element coupled to the select transistor, wherein the information storage element includes less than four transistor elements.

According to still another illustrative embodiment of the present invention, a static RAM cell comprises a transistor element having a gate electrode, a drain region, a source region, and a channel region that is electrically connected with the gate electrode. Moreover, the transistor element is configured to self-bias the gate electrode to maintain the channel region in a stationary conductive state.

According to yet another illustrative embodiment of the present invention, a static RAM cell comprises two or less transistor elements.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. Generally, the present invention is based on the concept that the circuit architecture of a plurality of logic circuit portions, especially of registers, static memory cells, and the like, may be significantly simplified in that one or more characteristics of a semiconductor switch element may be modified to obtain extended functionality. In particular, the inventors contemplated to provide a self-biasing semiconductor switch, which may be based in particular embodiments of the present invention on a field effect transistor design with a modified channel region, wherein a conductive state, once initiated, is maintained as long as the supply voltage is applied, unless a change of conductivity state is externally initiated. In this way, particularly the number count of individual switch elements in a static RAM cell may be drastically reduced compared to conventional RAM cell designs and may be less than six, thereby enabling the fabrication of fast storage devices with a bit density that is comparable with that of dynamic RAM devices.

Figure 2A:
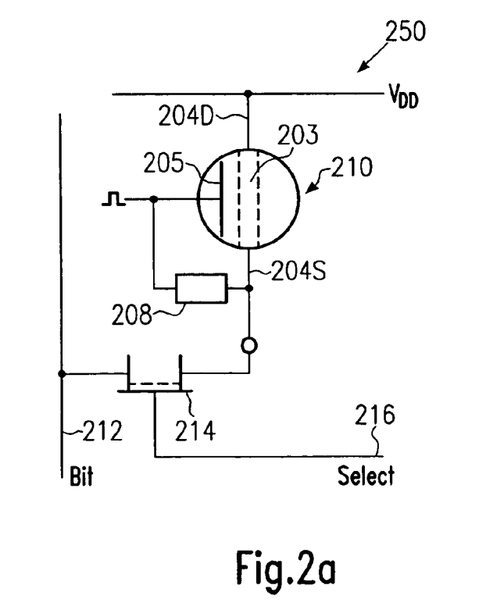
FIG. 2a schematically shows a circuit diagram of a storage element including a self-biasing semiconductor device in accordance with illustrative embodiments of the present invention.

FIG. 2a schematically shows a circuit diagram of a basic static RAM cell 250 comprising a bit cell 210 for storing an information bit. The bit cell 210 is coupled to a select transistor 214, which in turn is connected to a bit line 212 and a select line 216. The bit cell 210 is comprised of a semiconductor element including a channel region 203 that is configured to provide a controllable conductivity, wherein a gate electrode 205 is provided, which enables the control of the channel region 203 via capacitive coupling. Moreover, a feedback section 208 is provided, for instance in the form of an electrically conductive region having a specified resistivity or the like, to connect the channel region 203 via an output terminal 204s with the gate electrode 205. Furthermore, the channel region 203 may be connected to a specified voltage source, such as the source supplying the supply voltage VDD, by a respective output terminal 204d. The bit cell 210 is configured such that, upon application of a specified control voltage to the gate electrode 205, the conductivity of the channel region 203 changes from a moderately high impedance state into a state of moderately high conductivity, which may be maintained, even after interrupting the initial control voltage, via the feedback section 208. To this end, the semiconductor device 210 exhibits a specified behavior with respect to the conductivity of the channel region 203 in relation to the applied control voltage VG once the device 210 is in the conductive state, as will be explained with reference to FIG. 2b.

Figure 2B:
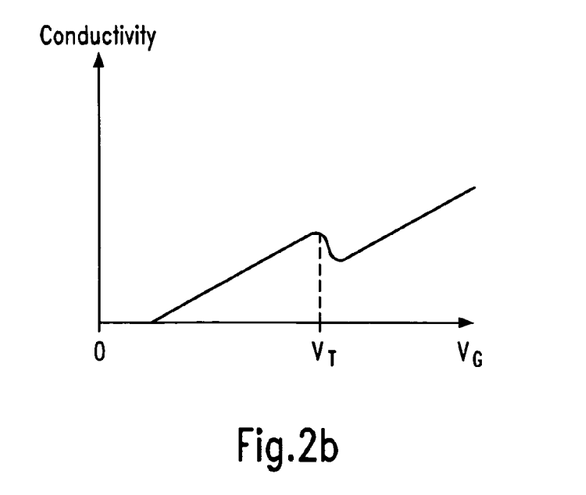
FIG. 2b schematically shows a qualitative plot of the progression of a channel conductivity versus an applied control voltage to obtain a self-biased stationary conductivity state according to an illustrative embodiment of the present invention.

FIG. 2b qualitatively describes the behavior of the bit cell 210 that is obtained by the above-described configuration. In FIG. 2b, the conductivity of the channel region 203 is plotted along the vertical axis in arbitrary units and the control voltage VG supplied to the gate electrode 205 is shown on the horizontal axis. The semiconductor device 210 is configured such that at a specified threshold voltage VT, which may be set by structural measures as will be described in more detail with reference to FIGS. 3a, 3b, 5 and 6, the conductivity of the channel region 203 shows a pronounced abrupt change or, in particular embodiments, a local maximum in such a way that with a further increase of the control voltage VG at the gate electrode 205 a significant drop in conductivity is obtained. In the further description, it is assumed that the voltage VDD is higher than the threshold voltage VT. Hence, after application of an initial control voltage in excess of the threshold voltage VT, the channel region 203 is in a highly conductive state so that the supply voltage VDD is more or less also present at the output 204s and, via the feedback section 208, at the gate electrode 205. Thus, even after discontinuing an initial control voltage, a corresponding voltage is supplied via the conductive channel region 203, the feedback section 208 to the gate electrode 205, wherein a self-stabilizing condition is established, since the channel conductivity increases as the voltage at the gate electrode 205 tends to decrease during discontinuing the initially supplied control voltage pulse owing to, for example, charge carrier leakage and the like. Consequently, due to the abrupt increase of the conductivity with decreasing voltage at the gate electrode 205 at VT, the voltage drop across the channel region 203 is reduced and charge, required at the gate electrode 205 for maintaining the conductivity of the channel region 203, is increasingly replaced, thereby maintaining the control voltage VG above or at the threshold voltage VT. As a result, a stationary conductive state of the channel region 203 is achieved and may be maintained as long as the supply voltage VDD is provided. This state will hereinafter also be referred to as self-biased state of the bit cell 210.

Again referring to FIG. 2a, during operation of the static RAM cell 250, the bit cell 210 may be written to by pre-charging the bit line 212 with a voltage above or at the threshold voltage VT, for instance VDD, and by activating the select line 216, thereby switching the select transistor 214 from its off-state into its on-state. When the selector transistor 214 is in its on-state, the voltage at the bit line 212 is supplied via the feedback section 208 to the gate electrode 205, which is correspondingly charged to generate a conductivity of the channel region 203, as is qualitatively shown in FIG. 2b, at or above the threshold voltage VT. Thereafter, the select transistor 214 may be disabled and the bit line 212 may be brought into a high impedance state so that it is prepared for a read operation. Due to the self-biasing mechanism of the bit cell 210, the conductivity of the channel region 203 is maintained at a moderately high value, even though the initial control voltage pulse supplied via the select transistor 214 is discontinued. As previously explained, this low impedance state of the bit cell 210 is stationary and remains as long as the supply voltage VDD is present or a new write cycle is initiated. During reading of the bit cell 210, the bit line 212 may be in a high impedance state and the select transistor 214 may be switched into its on-state by activating the select line 216. Due to the self-biased high conductivity state of the bit cell 210, charge may be supplied from the supply voltage source VDD to the bit line 212 to establish the voltage VDD at the bit line 212, which may be sensed by a corresponding sense amplifier (not shown). Thus, a logic state corresponding to the self-biased state of the bit cell 210 may be identified and read out. Similarly, a high impedance state may be written into the bit cell 210 by, for instance, pre-charging the bit line 212 with ground potential and activating the select line 216. In this case, the ground potential is supplied to the gate electrode 205 via the feedback section 208—the inherent resistance of the bit line 212 is assumed to be significantly lower than the resistance of the channel region 203 in its high conductivity state—and hence the channel region 203 is brought into its high impedance state, which is maintained even if the bit line 212 is decoupled from the output 204s by deactivating the select line 216.

As a result, by means of the semiconductor bit cell 210, a significantly simplified architecture for a static RAM cell is obtained, wherein particularly the number of individual semiconductor elements may be less than in the conventional RAM cell described with reference to FIG. 1d.

Figure 3A:
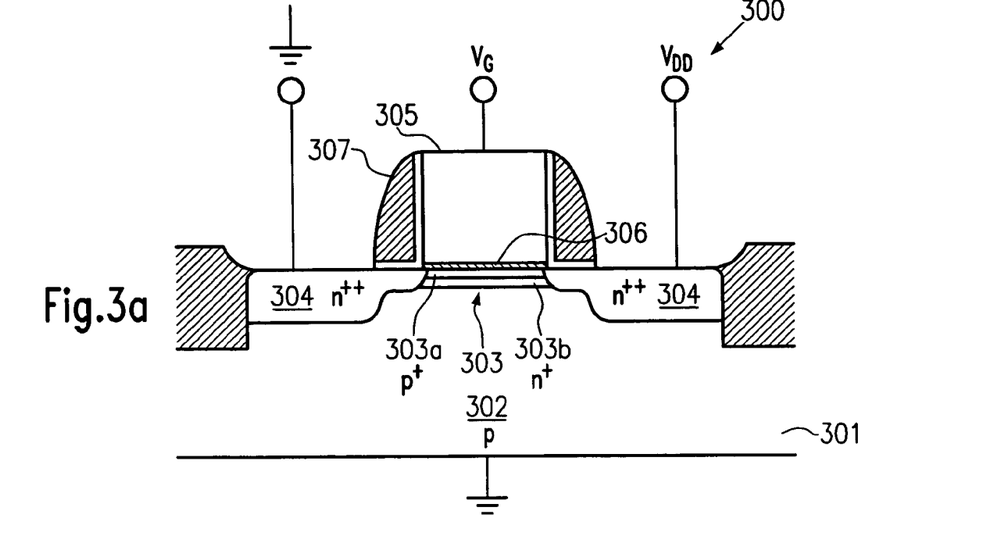
FIGS. 3a and 3b schematically show cross-sectional views of transistor elements, each having two inversely doped channel regions for an N-type double channel transistor and a P-type double channel transistor, respectively, according to particular embodiments of the present invention.

FIG. 3a schematically shows a cross-sectional view of a transistor element 300 that may be used in forming a self-biasing semiconductor device, such as the self-biasing bit cell 210 in FIG. 2a. The transistor element 300 comprises a substrate 301, which may be any appropriate substrate, such as a bulk semiconductor substrate, an insulating substrate having formed thereon a crystalline semiconductor layer, and the like. In particular embodiments, the substrate 301 may represent a bulk silicon substrate or a silicon-on-insulator (SOI) substrate, since presently and in the near future the vast majority of complex integrated circuits is and will be fabricated on the basis of silicon. It should be appreciated, however, that the principles of the present invention may also be realized on the basis of other semi-conductor materials, such as gallium arsenide, germanium, and the like. Formed on the substrate 301 is a substantially crystalline semiconductor region 302, which may comprise a specified dopant material to provide a specified conductivity type for the region 302. In the embodiment shown in FIG. 3a, the semiconductor region 302 is doped to provide a P-conductivity. Adjacent to the region 302 are formed drain and source regions 304 including a dopant material that imparts an opposite conductivity type to the semiconductor region 302. In the present case, the drain and source regions 304 are heavily doped so that corresponding PN junctions are formed along interfaces between the drain and source regions 304 and the semiconductor region 302. Moreover, a channel region 303 is formed between the drain and source regions 304, wherein, contrary to the conventional transistor design as is explained with reference to FIG. 1a, the channel region 303 is modified in that it defines a specified threshold voltage at which an abrupt conductivity change occurs yet still providing a moderately high conductivity at both sides of the specified threshold voltage.

In one particular embodiment, the channel region 303 may comprise a first channel sub-region 303a that is inversely doped with respect to the drain and source regions 304. Thus, the first channel sub-region 303a may be considered as a "conventional" channel region of a conventional enhancement transistor, such as, for instance, the transistor 100 in FIG. 1a. Additionally, in this particular embodiment, the channel region 303 may further comprise a second channel sub-region 303b that is inversely doped to the first channel sub-region 303a, and may therefore be considered as a "depletion" channel. Since the transistor device 300 of FIG. 3a represents an N-type transistor, the first channel sub-region 303a is P-doped and the second channel sub-region 303b is N-doped. The transistor element 300 further comprises a gate electrode 305 located to enable the control of the first and second channel sub-regions 303a and 303b by capacitive coupling. In the embodiments shown, the gate electrode 305 is separated from the channel region 303 by a gate insulation layer 306 comprised of silicon dioxide and/or silicon nitride and/or silicon oxynitride and/or high-k dielectric materials and the like. Moreover, the transistor element 300 may comprise sidewall spacers 307 formed on sidewalls of the gate electrode 305. It should be appreciated that further components, such as metal silicates, in case the gate electrode 305 and the drain and source regions 304 are substantially comprised of silicon, are not illustrated but may be provided in accordance with design requirements. Furthermore, it is to be noted that other transistor configurations, for instance including raised drain and source regions and the like, may also be employed with the present invention. Moreover, any contact portions that typically provide an electrical connection to the drain and source regions 304 and the gate electrode 305 are not shown. In particular embodiments, a connection may be provided that connects one of the drain and source regions 304 with the gate electrode 305, as is schematically shown in FIG. 2a in the form of the feedback section 208. A corresponding connection may be established in the form of a so-called local interconnect.

Figure 3B:
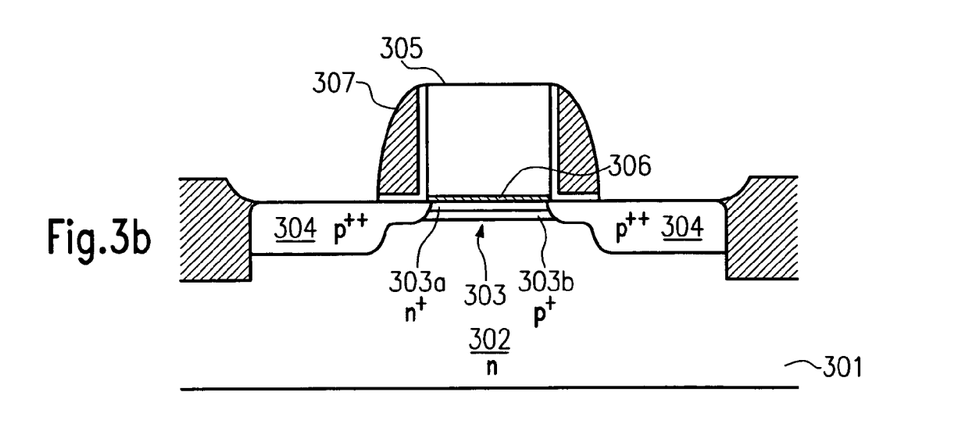

FIG. 3b schematically shows the transistor element 300 when configured as a P-type transistor. Hence, the transistor element 300 of FIG. 3b comprises the same components as previously described with reference to FIG. 3a with the exception that the drain and source regions 304, the channel sub-regions 303a and 303b, and the semiconductor region 302 are inversely doped compared to the device of FIG. 3a.

A typical process flow for forming the semiconductor device 300 as shown in FIG. 3a or FIG. 3b may comprise the following processes. After the formation of any isolation structures (not shown) to define the overall dimensions of the transistor 300 and to provide electrical insulation to neighboring circuit elements, the vertical dopant profile of the semi-conductor region 302 may be created by well-established ion implantation cycles. During this ion implantation sequence, also the vertical dopant profile of the channel region 303 may be established. For example, after doping the semiconductor region 302 with a P-type material by ion implantation and/or by providing a pre-doped substrate or by forming an epitaxial grown semiconductor layer in a deposition atmosphere including a dopant, an N-doped region corresponding to the second channel sub-region 303b (FIG. 3a) may be created. For this purpose, a surface portion of the semiconductor region 302 may be pre-morphine to reduce any channeling effects during the ion implantation of the N-type dopant material for defining the second channel sub-region 303b. Thereafter, a further ion implantation sequence may be performed to create the P-doped first channel sub-region 303a, wherein, in both implantation cycles, the dose and implantation energy may be appropriately selected to achieve a desired concentration and a specified depth within the semiconductor region 302. Corresponding process parameters may readily be obtained by performing simulation calculations and/or test runs. In other embodiments, one or two semiconductor layers may be epitaxial grown in a deposition atmosphere containing the required type of dopant. For instance, an N-type semiconductor layer may be grown on the semiconductor region 302, followed by the epitaxial growth of a P-type semiconductor layer with a desired thickness. Similarly, the semiconductor region 302 may be implanted to create the second channel sub-region 303b and subsequently a layer for the first channel sub-region 303a may be formed by epitaxial growth in a dopant-containing atmosphere. Moreover, after forming the channel region 303, additional threshold voltage implantations may be performed to correspondingly adjust the finally obtained thresholds for the controllability of the channel region 303 by means of the gate electrode 305. Thereafter, the gate insulation layer 306 and the gate electrode 305 may be formed in conformity with conventionally established processes, followed by advanced implantation cycles for forming the drain and source regions 304. Afterwards, further processes including anneal cycles for activating dopants and re-crystallizing morphine or damaged crystalline portions in the drain and source regions 304, the semiconductor region 302, and the channel region 303, followed by other processes such as solicitation and the like, may be performed in accordance with well-established process techniques.

Figure 3C:
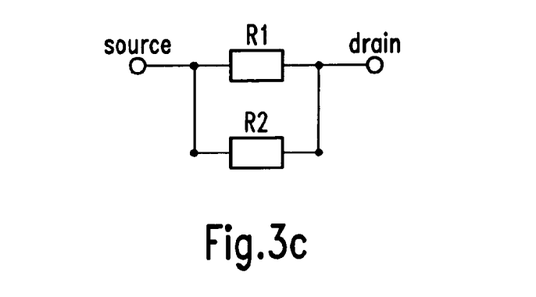
FIG. 3c schematically illustrates a circuit diagram for a simplified model of a double-channel field effect transistor in accordance with illustrative embodiments of the present invention.

The basic operational behavior of the transistor element 300 will now be explained with reference to the N-type transistor of FIG. 3a, wherein corresponding explanations with inverse voltages also apply to the device 300 of FIG. 3b. It is assumed that the region 304 on the left-hand side of FIG. 3a represents the source region and is connected to ground potential. Similarly, the semiconductor region 302 is connected to ground potential while the region 304 on the right-hand side is connected to the supply voltage VDD to act as a drain region. The gate electrode 305 is connected to a voltage source that may provide a control voltage VG. Any values for applied voltages are given with respect to the ground potential, to which the semiconductor region 302, as well as the source region 304, are connected in the example shown. Applying a zero voltage VG may lead to a relatively low conductivity of the channel regions 303, that is, it may represent a substantially high impedance state of the transistor 300, since the first channel sub-region 303a may be operated below its threshold voltage for providing sufficient minority charge carriers to establish a conductive channel, as is previously explained with reference to the enhancement transistor of FIG. 1b. On the other hand, the second channel sub-region 303b forming a PN-junction with the overlying region 303a may donate some of its majority charge carriers to the region 303a, which in turn may provide some of its majority charge carriers to the region 303b until a corresponding space charge area is established. Thus, the second channel sub-region 303b may also form a space charge area with respect to the neighboring drain region 304, wherein this area is inversely biased by VDD and ground potential to significantly reduce the conductivity of the second channel sub-region 303b. Consequently, the overall conductance of the channel region 303 is moderately low. Upon increasing the control voltage VG, electrons are increasingly redistributed to the second channel region 303b, thereby increasing the overall conductivity, while the first channel sub-region 303a is still below its threshold value. When the control voltage VG reaches the threshold voltage for the first channel sub-region 303a, which will be referred to as VT1, the conductivity thereof abruptly increases, and hence the overall conductivity of the channel region 303 also abruptly increases. It is further assumed that the second channel sub-region 303b has a second threshold value, referred to in the following as VT2, at which the channel is completely depleted, wherein the corresponding threshold voltage is adjusted to be significantly higher than the first threshold voltage VT1, determining the behavior of the first channel sub-region 303a. Thus, upon further increasing the voltage VG, both channels are conductive, thereby imparting a relatively high conductivity to the entire channel region 303. Upon reaching the second threshold voltage VT2 and thus resulting in the depletion of the second channel sub-region 303b, the overall conductivity abruptly decreased since the current flow is now restricted to the first channel sub-region 303a. Upon further increasing the control voltage VG, the overall conductivity again increases since the conductivity of the first channel region 303a continuously increases while the second channel sub-region 303b is still in a high impedance state. FIG. 3c schematically shows a simplified electrical model of the transistor element 300 shown in FIG. 3a or 3b. Hereby, it is assumed that the first channel sub-region 303a is represented by a first resistor R1, while the second channel sub-region 303b is represented by a resistor R2. The resistors R1 and R2 may have a resistance value on the order of magnitude of 1000 ohms. Moreover, in this simplified model, it is assumed that the resistance value of R1 may take on a high value below the first threshold voltage VT1, which is substantially determined by the structural specifics of the transistor element 300. Similarly, in this model and as explained above, the resistor R2 is assumed to take on a high impedance state when the device 300 is operated with a gate voltage at or above the second threshold voltage VT2, since then the second channel sub-region 303b is substantially completely depleted.

Figure 3D:
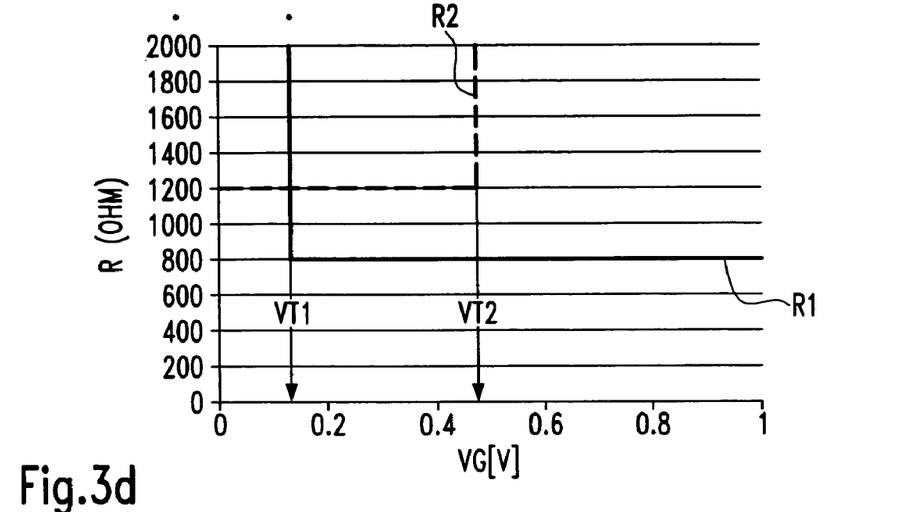
FIG. 3d schematically illustrates a plot of a channel conductivity for each of the two channels in the double channel transistor in a simplified fashion.

FIG. 3d illustrates the above-explained behavior in a qualitative fashion, wherein the vertical axis represents the resistance values of the resistors R1 and R2, while the horizontal axis indicates the applied gate voltage VG. As shown in the simplified model, the second channel sub-region 303b exhibits a substantially constant ohm-resistance of approximately 1200 ohms at gate voltages below the second threshold voltage VT2, which is approximately 0.45 volts in the present example. Likewise, the first channel sub-region 303a exhibits a high resistance value for gate voltages below the first threshold voltage VT1, which is here selected to be approximately 0.15 volts, and abruptly changes to approximately 800 ohm for gate voltages above the first threshold voltage VT1. It should be appreciated that actually the channel conductivity in the low-impedance state varies with the gate voltage, wherein, however, this variation is negligible compared to the abrupt change at the respective threshold voltages VT1 and VT2 and is therefore not shown in FIG. 3d.

Figure 3E:
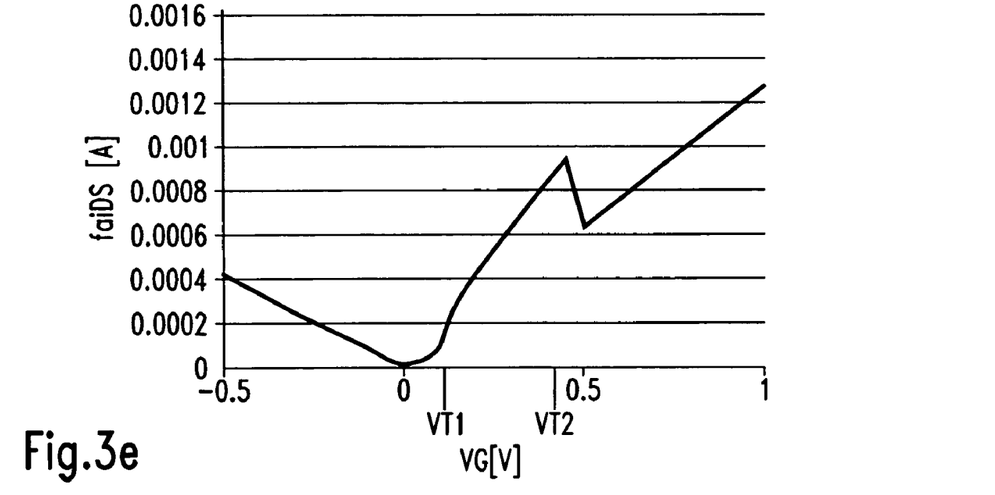
FIG. 3e schematically shows a plot qualitatively illustrating the drain currents, i.e., the channel conductivity of the double channel transistor with respect to a variation of the gate voltage according to illustrative embodiments.

FIG. 3e schematically shows a graph representing the current flow through the channel region 303, which may also be considered as representing the conductivity of the channel region 303, with a varying gate voltage. For negative gate voltages, the resistor R1 is in its high impedance state, while the resistor R2 is in its low holmic state, wherein a slight reduction in the conductivity may be observed due to the typical dependence of the drain current from the gate voltage, i.e., the number of free charge carriers is determined by the gate potential and thus leads to a typical variation of the channel conductivity and hence of the channel resistance, which is not taken into consideration in the model shown in FIG. 3d since the variation of the resistance in the on-state is significantly less compared to the difference between the high impedance state and the high conductivity state. At a gate voltage of approximately 0, the total conductivity has a minimum, as previously explained, and slightly increases for positive gate voltages until the threshold VT1 is reached, which causes an abrupt change in conductivity. Thereafter, both resistances R1 and R2 are in their low-holmic state and the drain current, and thus the conductivity, increases with increasing gate voltage mainly due to the variation of the first channel resistance. At the second threshold voltage VT2, the second channel is depleted and hence the total drain current, and thus the total conductivity of the channel region 303, is abruptly decreased and starts increasing from a lower level with increasing gate voltage due to the ongoing increase in conductivity of the first channel region 303a. Consequently, the transistor elements 300 exhibit a behavior of the channel conductivity as is explained with reference to FIG. 2b, thereby enabling the formation of a semiconductor device, such as the bit cell 210 of FIG. 2a, on the basis of conventional transistor technologies with a modification of the channel region, as is described, for instance, with reference to the channel region 303.

Figure 4A:
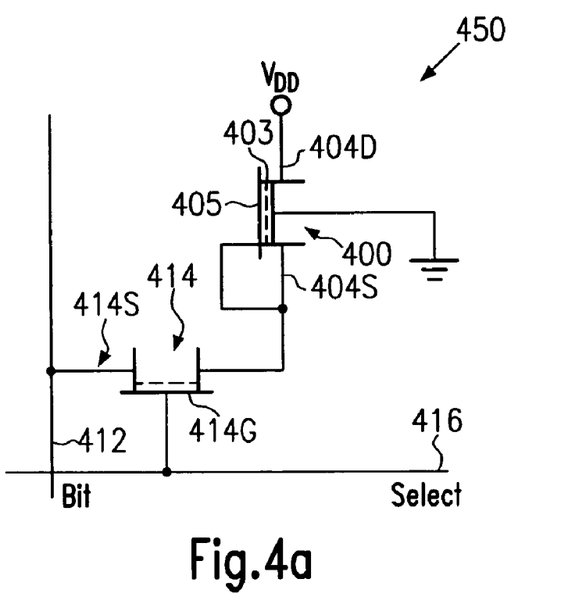
FIG. 4a schematically shows a circuit diagram of a static RAM cell, including a double channel transistor in accordance with a particular embodiment of the present invention, wherein the RAM cell comprises only two transistor elements.

FIG. 4a schematically shows a circuit diagram of an SRAM cell 450 including a transistor element having a modified channel region to store a bit of information. The cell 450 comprises a transistor element 400 having a modified channel region 403 that may include a first channel region and a second channel region, as is shown, for instance, in FIGS. 3a and 3b. Moreover, the transistor element 400 comprises a gate electrode 405 and a drain terminal 404d and a source terminal 404s. FIG. 4a also illustrates a circuit symbol for a field effect transistor having a modified channel configuration that provides the above-described characteristic and which may, in particular embodiments, provide a double channel configuration. Moreover, the gate electrode 405 and the source terminal 404s are electrically connected and are both connected to a select transistor 414, the gate 414g of which is connected to a select line 416 while a source/drain terminal 414s is connected to a bit line 412. In one particular embodiment, the SRAM cell 450 merely includes the transistor elements 414 and 400 as the only transistor elements and does not require any further active components. In other embodiments, further transistor elements may be provided to enhance the functionality and/or the reliability of the cell 450 as will be described later on. It is to be noted, however, that the total number of transistor elements may still be less than six transistor elements, as in the conventional design shown in FIG. 1d. It should be appreciated that the transistor elements 400 and 414 may be readily formed in accordance with the process flow as previously described with reference to FIGS. 3a and 3b, wherein any additional process steps for forming the modified channel region 403 may be performed, for instance by ion implantation, while the transistor 414 is masked so that a high degree of compatibility is still maintained for the entire process flow for forming the cell 450.

The operation of the cell 450 is substantially the same as is previously described with reference to FIGS. 2a and 2b. That is, when writing a logic 1 state into the cell 450, that is, into the transistor element 400, the bit line 412 may be pre-charged and the select transistor 414 may be turned on by activating the select line 416. Hereby, the gate 405 is set to the potential of the bit line 412, which is assumed to be VDD that, in turn, is higher than the specified threshold voltage, at which the conductivity of the channel region 403 has a local maximum. For convenience, the specified threshold voltage may be referred to as VT2, as shown in FIGS. 3e and 3d. As a result of the application of VDD at the gate electrode 405, the channel conductivity is in its low impedance state, but is located at the right side of the threshold value VT2 (FIG. 3e). After disconnecting the transistor element 400 from the pre-charged bit line 412 by deactivating the select line 416, the high conductivity state is maintained since now the transistor element 400 is in a self-biased stationary state, which leads to an increase of conductivity whenever the gate voltage tends to drop. As a result, the source terminal 404s is maintained at a voltage at or above the threshold voltage VT2, thereby indicating a logic high state. This state may be read out in the same way as is described with reference to FIG. 2a. Similarly, a high impedance state may be written into the cell 450 by correspondingly pre-charging the bit line 412 and activating the select line 416. In this case, the conductivity of the channel region 403 is low and remains low unless a new state is written into the cell 450.

Figure 4B:
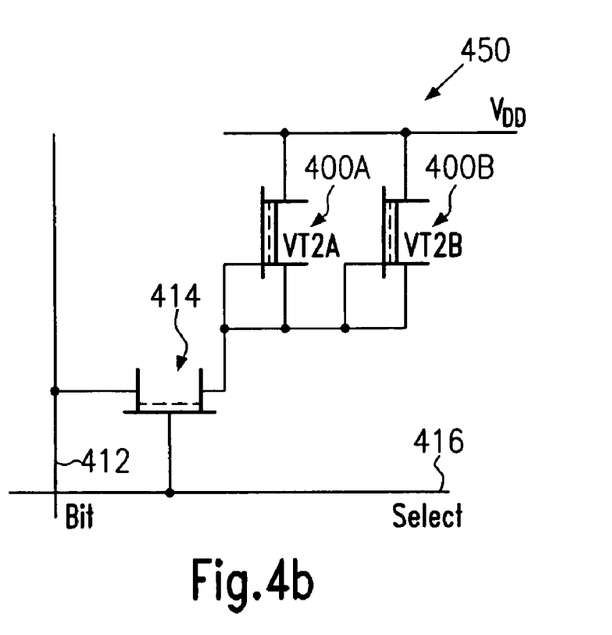
FIG. 4b schematically shows a circuit diagram of a RAM cell including less than six transistor elements in accordance with a further illustrative embodiment.

FIG. 4b schematically shows a circuit diagram describing the SRAM cell 450 containing more than two transistor elements, but less than six transistor elements. In this embodiment, a first double channel transistor element 400a and a second double channel transistor element 400b are provided, which may differ from each other by a different threshold voltage VT2a and VT2b. A corresponding arrangement may be advantageous in operating the cell 450 with two different supply voltages VDD, wherein a first operating mode may be considered as a low current mode with a reduced supply voltage and possibly reduced operating speed, while a high current mode may allow the operation with an increased supply voltage, thereby possibly improving the total operating speed and/or the signal-to-noise ratio for storing information in the cell 450. It is assumed that the transistor element 400a may have threshold voltage VT2a being less compared to threshold voltage VT2b of the transistor element 400b. The generation of different threshold voltages VT2 may readily be achieved during the fabrication of the cell 450 in that, for example, a first implantation sequence is performed to form the channel region of the device 400a while the device 400b is masked, and performing a second implantation sequence with the device 400a masked and the device 400b exposed. Other approaches for the generation of different threshold voltages will also be described with reference to FIG. 6.

During the operation of the cell 450, the write and read cycles may be performed as previously described, wherein, when operated at a higher VDD, the transistor element 400b is operated in the self-biasing mode and thus maintains its gate voltage and the gate voltage of the transistor element 400a at the high threshold voltage VT2b when remaining in the high conductivity state. Likewise, when being operated with a low VDD that may range between the threshold VT2b and VT2a of the transistor 400b and the transistor 400a, the device 400a remains in the high conductivity state and thus keeps the gate voltages of the devices 400a and 400b at the lower threshold voltage VT2a.

It should also be appreciated that more than two devices with different threshold voltages VT2 may be provided in the cell 450, thereby providing the potential for an enhanced functionality. For example, the device 450 may be used to store three different states, one state representing a high impedance state, one state representing a high conductivity state with a gate voltage at the lower threshold voltage VT2a, and one state representing a high conductivity state at the higher threshold voltage VT2b of the device 400b. When writing corresponding states into the cell 450, the bit line has to be pre-charged with respective voltages. Likewise, when more than two transistor elements with different threshold voltages VT2 are provided, a corresponding number of different states may be stored in the cell 450, wherein a single select line 416 and a single bit line 412 is sufficient to address the cell 450 having stored therein a plurality of different states. In other applications, the lower threshold VT2a may be considered as a stand-by threshold, to ensure data integrity when the supply voltage VDD decreases below the normal operating voltage due to a sleep mode, during which the supply voltage may be delivered by a storage capacitor or the like.

Figure 5:
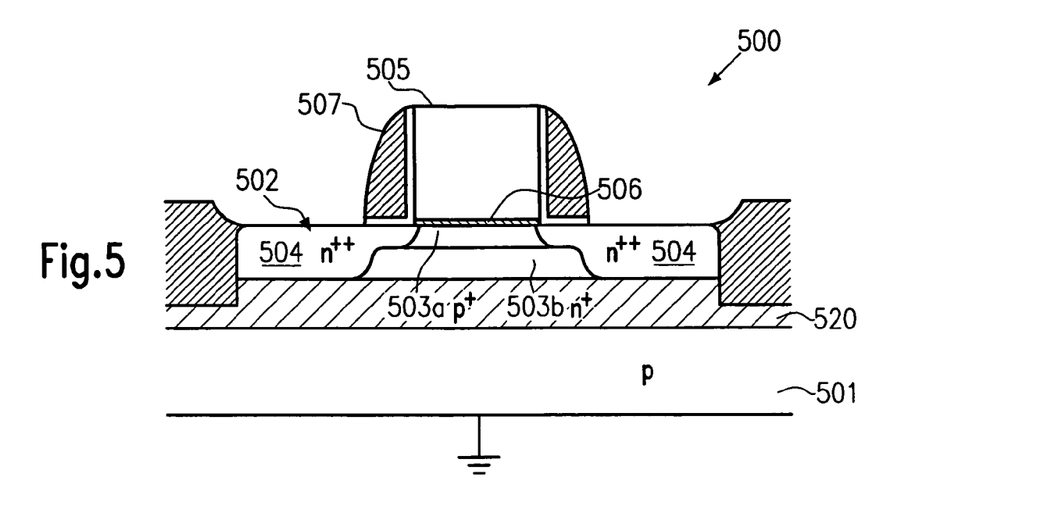
FIG. 5 schematically shows a cross-sectional view of an SOI transistor element having two inversely doped channel regions according to one illustrative embodiment.

FIG. 5 schematically shows a cross-sectional view of a double channel transistor element 500 in the form of an N-type transistor configured as an SOI device. Thus, the transistor element 500 comprises drain and source regions 504 formed in a semiconductor layer 502 located above an insulation layer 520. The insulation layer 520 may represent a thin dielectric layer formed on any appropriate substrate 501, which is typically a bulk semi-conductor substrate such as a silicon substrate. Furthermore, the device 500 comprises a first channel region 503a and a second channel region 503b, which are inversely doped to provide the required channel characteristics as previously described. A gate electrode 505 is formed above the channel regions 503a, 503b, and is separated there from by a gate insulation layer 506.

The transistor element 500 may be manufactured in accordance with conventional process techniques, wherein the channel regions 503a, 503b may be formed by ion implantation and/or epitaxial growth techniques, as is previously described with reference to FIGS. 3a and 3b. The SOI device 500 may be advantageously incorporated into complex micro-processors, which are increasingly fabricated as SOI devices.

Figure 6:
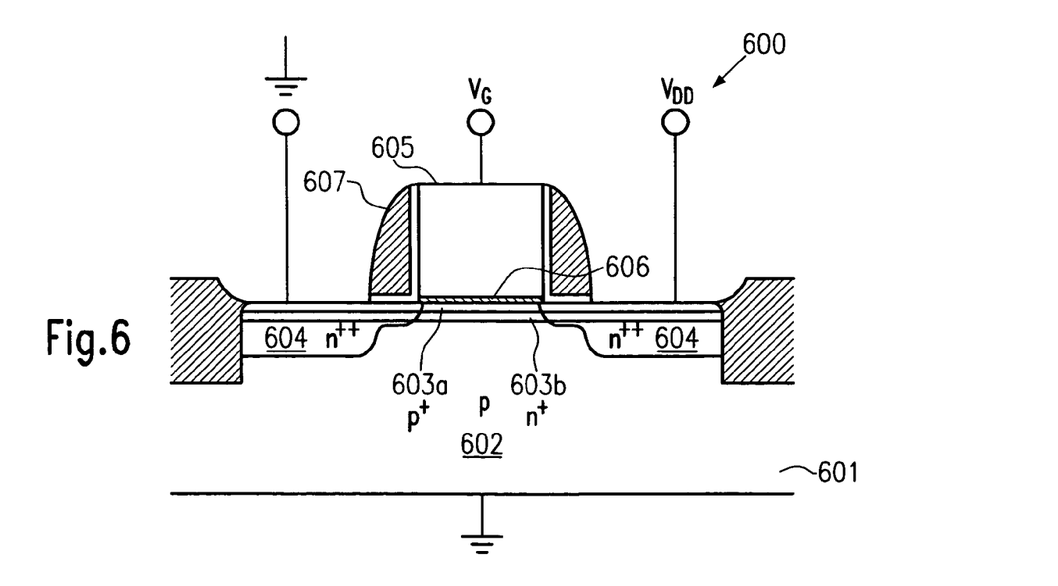
FIG. 6 schematically shows a cross-sectional view of a transistor element having inversely doped channel regions, which also differ in at least one of material composition and internal strain.

FIG. 6 schematically shows a double channel transistor element 600 comprising a substrate 601 with a crystalline semiconductor region 602 formed thereon or therein. Drain and source regions 604 having a first conductivity type are formed within the regions 602 to form a PN-junction with the remainder of the semiconductor regions 602, which is doped to exhibit a second conductivity type. Between the drain and source regions 604, a first channel region 603a and a second channel region 603b are formed such that the first channel region 603a is located more closely to a gate electrode 605, which is separated from the channel region 603a by a gate insulation layer 606. The first channel region 603a may be doped to exhibit the second conductivity type, whereas the second channel region 603b may exhibit the first conductivity type. In the example illustrated, an N-type double channel transistor is considered. Regarding any threshold voltages VT1 and VT2 (FIGS. 3d and 3e), the same criteria apply as previously explained. Moreover, the first and second channel regions 603a, 603b differ from each other in at least one of material composition and internal strain. That is, the characteristics of the respective channel regions may not only be determined by dopant concentration, but also by other parameters such as material composition, internal strain, and the like. For instance, the second channel region 603b may be comprised of a silicon/germanium composition, which may be formed by epitaxial growth with a subsequent growth of a silicon layer for the first channel region 603a, wherein, depending on process requirements, the layer 603b may be relaxed or not to have specified internal strain or to impart a specified stress to the layer 603a. Similarly, the channel region 603a may be provided as a strained silicon/germanium layer. Also, other materials such as silicon/carbon may be used with appropriate composition in one or both of the channel regions 603a and 603b. Thus, the various thresholds VT1 and VT2 for the channel regions 603a and 603b may effectively be adjusted by correspondingly selecting a specified material composition and/or a specified internal strain. Since strain engineering becomes more and more important in advanced MOS devices, corresponding process schemes may also be advantageously employed in designing the double channel transistor characteristics. For instance, different threshold voltages may be created at different die regions for the same transistor configuration by locally modifying the strain.

In other embodiments, a specific internal strain in the channel region 603a and/or 603b may be created by applying external stress, for instance by means of a specifically stress-containing capping layer enclosing the transistor element 600. In other embodiments, stress may be created additionally or alternatively by a corresponding implantation of specific ion species, such as hydrogen, helium, oxygen, and the like, in or in the vicinity of the first and second channel regions 603a, 603b, thereby specifically adjusting the respective threshold voltages. The adjustment of threshold voltages by stress created by ion implantation is advantageous when a plurality of different threshold voltages have to be created at different die locations or different substrate locations, since respective implantations may readily be performed with different mask schemes in conformity with device requirements.

As a result, the present invention provides a self-biasing semiconductor device that may mostly be advantageously used in combination with static storage cells, such as RAM cells, to significantly reduce the number of transistor elements required. Since already well-established process techniques may be used in forming a corresponding self-biasing transistor element, for instance in the form of a double channel transistor, a significant improvement in bit density and/or performance may be achieved for a given technology node. Moreover, since SRAM devices may now be fabricated in a highly efficient manner with a bit density comparable to dynamic RAM devices, the dynamic devices, usually employed as external operating memory for CPUs, may be readily replaced, thereby providing immense cost and performance advantages. Moreover, the simplified SRAM design of the present invention in combination with a low-cost power supply enables a cost-effective utilization of SRAM devices in a wide variety of applications, which may currently employ magnetic storage devices or EEPROMs.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
    a drain region formed in a substantially crystalline semiconductor material and doped with a first type of dopant material;
    a source region formed in said substantially crystalline semiconductor material and doped with the first type of dopant material;
    a first channel region located between said drain region and said source region and doped with the first type of dopant material;
    a second channel region located between said drain region and said source region and adjacent to the first channel region and being doped with a second type of dopant material differing from said first type of dopant material, wherein the first channel region is disposed below said second channel region and said first type of dopant material results in a first type of conductivity and said second type of dopant material results in a second type of conductivity that is inverted with respect to said first type of conductivity; and
    a gate electrode disposed above the first and second channel regions and located to enable control of the first and second channel regions, wherein said first and second channel regions in combination define a first threshold voltage of the semiconductor device for transitioning a total conductivity of the first and second channel regions into a low impedance state and a second threshold voltage of the semiconductor device that results in an abrupt conductivity change of the total conductivity of said first and second channel regions when said total conductivity is in the low impedance state.

2. The semiconductor device of claim 1, further comprising a gate insulation layer that is in contact with said gate electrode and said second channel region.

3. The semiconductor device of claim 1, further comprising a conductive region connecting one of said drain region and said source region with said gate electrode.

4. The semiconductor device of claim 1, further comprising a select transistor having a drain terminal, a source terminal and a gate terminal, one of said drain and source terminals connected to said conductive region.

5. The semiconductor device of claim 4, wherein the other one of said drain and source terminal is connected to a read/write line and said gate electrode is connected to a select line.

6. The semiconductor device of claim 1, further comprising:
    a second drain region formed in a second substantially crystalline semiconductor material and doped with the first type of dopant material;
    a second source region formed in said second substantially crystalline semiconductor material and doped with the first type of dopant material;
    a third channel region located between said second drain region and said second source region and doped with the first type of dopant material;
    a fourth channel region located between said second drain region and said second source region and adjacent to said third channel region and being doped with the second type of dopant material differing from said first type; and
    a second gate electrode located to enable control of the third and fourth channel regions, wherein the drain region, source region, first and second channel regions, and the gate electrode define a first transistor, and the second drain region, second source region, third and fourth channel regions, and second gate electrode define a second transistor.

7. The semiconductor device of claim 6, wherein said third and fourth channel regions in combination define a second threshold voltage for a second abrupt conductivity change of a total conductivity of said third and fourth channel regions when operated in a low impedance state.

8. The semiconductor device of claim 7, wherein the second threshold voltage differs from the first threshold voltage.

9. The semiconductor device of claim 1, wherein the first and second channel regions differ in at least one of material composition and internal strain.

10. The semiconductor device of claim 1, wherein said first type of dopant material results in a first type of conductivity and said second type of dopant material results in a second type of conductivity that is inverted to said first type of conductivity.

11. A static RAM cell, comprising:
a select transistor; and
an information storage element coupled to said select transistor, said information storage element including less than four transistor elements, wherein one of the transistor elements comprises a first controllable semiconductor device including at least:
a first drain region formed in a substantially crystalline semiconductor material and doped with a first type of dopant material;
a first source region formed in said substantially crystalline semiconductor material and doped with the first type of dopant material;
a first channel region located between said first drain region and said first source region and doped with the first type of dopant material;
a second channel region located between said first drain region and said first source region and adjacent to the first channel region and being doped with a second type of dopant material differing from said first type of dopant material, wherein the first channel region is disposed below said second channel region and said first type of dopant material results in a first type of conductivity and said second type of dopant material results in a second type of conductivity that is inverted with respect to said first type of conductivity; and
a first gate electrode disposed above the first and second channel regions and located to enable control of the first and second channel regions, wherein said first and second channel regions in combination define a first threshold voltage of the semiconductor device for transitioning a total conductivity of the first and second channel regions into a low impedance state and a second threshold voltage of the semiconductor device that results in an abrupt conductivity change of the total conductivity of said first and second channel regions when said total conductivity is in the low impedance state.

12. The static RAM cell of claim 11, wherein said first controllable semiconductor device has at least one stationary conductive state and said first gate electrode is configured to control a conductivity of said first and second channel regions, one of said first source region and said first drain region being connected to said first gate electrode and being configured to self-bias said first gate electrode when said first controllable semiconductor device is in said at least one stationary conductive state.

13. The static RAM cell of claim 12, wherein said first and second channel regions are formed between said first drain region and said first source region and are configured to define at least a first threshold for an absolute amount of voltage applied to the first gate electrode, said first threshold being a lower limit for a gate voltage to transit into said self biased at least one stationary conductive state.

14. The static RAM cell of claim 12, wherein said information storage element comprises a second controllable semiconductor device having at least one stationary conductive state and having a second source region, a second drain region, a third channel region formed therebetween, and a second gate electrode configured to control a conductivity of said third channel region, at least one of said second source region and said second drain region being connected to said second gate electrode and being configured to self-bias said second gate electrode when said second controllable semiconductor device is in said at least one stationary conductive state.

15. The static RAM cell of claim 14, wherein said second controllable semiconductor device is operable in a self-biased state with a second control voltage that differs from a first control voltage required to operate said first controllable semiconductor device in a self-biased state.

16. The static RAM cell of claim 11, wherein said first and second channel regions differ in at least one of material composition and internal strain.

17. A static RAM cell, comprising:
a transistor element having a gate electrode, a drain region formed in a substantially crystalline semiconductor material and doped with a first type of dopant material, a source region formed in said substantially crystalline semiconductor material and doped with the first type of dopant material, a channel region electrically connected with said gate electrode and controllable by said gate electrode, the channel region including a first sub-region doped with the first type of dopant material and a second sub-region doped with a second type of dopant material differing from said first type of dopant material, wherein the gate electrode is disposed above the first and second channel regions, the first channel region is disposed below said second channel region, said first type of dopant material results in a first type of conductivity and said second type of dopant material results in a second type of conductivity that is inverted with respect to said first type of conductivity, said first and second channel regions in combination define a first threshold voltage of the semiconductor device for transitioning a total conductivity of the first and second channel regions into a low impedance state and a second threshold voltage of the semiconductor device that results in an abrupt conductivity change of the total conductivity of said first and second channel regions when said total conductivity is in the low impedance state, and said transistor element is configured to self-bias said gate electrode to maintain said channel region in a stationary conductive state.

18. The static RAM cell of claim 17, further comprising a select transistor element coupled to said transistor element.

19. The static RAM cell of claim 18, wherein a total number of transistor elements is less than six.

20. The static RAM cell of claim 17, wherein said channel region is formed between said drain region and said source region and is configured to define at least a first threshold for an absolute amount of voltage applied to the gate electrode, said first threshold being a lower limit for a gate voltage to transit into said self-biased stationary conductive state.

21. The static RAM cell of claim 17, wherein said transistor element further comprises a doped semiconductor region having a conductivity type and being located adjacent to said drain region, source region and said channel region, said conductivity type differing from a conductivity type of said drain region and source region.

22. The static RAM cell of claim 17, wherein said transistor element further comprises an insulation layer formed adjacent to said drain and source regions and said channel region, said insulation layer isolating said transistor element from a substrate.

23. The static RAM cell of claim 17, wherein said first and second sub-regions differ in at least one of material composition and internal strain.

24. The static RAM cell of claim 17, further comprising a second transistor element having at least one self-biased stationary conductive state and having a second channel region and a second gate electrode configured to control a conductivity of said second channel region, said second channel region connected to said second gate electrode and being configured to self-bias said second gate electrode when said transistor element is in said at least one self-biased stationary conductive state.

25. A static RAM cell comprising two or less transistor elements wherein at least one of the two or less transistor elements is a double channel transistor element that includes at least:

a drain region formed in a substantially crystalline semiconductor material and doped with a first type of dopant material;

a source region formed in said substantially crystalline semiconductor material and doped with the first type of dopant material;

a first channel region located between said drain region and said source region and doped with the first type of dopant material;

a second channel region located between said drain region and said source region and adjacent to the first channel region and being doped with a second type of dopant material differing from said first type of dopant material, wherein the first channel region is disposed below said second channel region and said first type of dopant material results in a first type of conductivity and said second type of dopant material results in a second type of conductivity that is inverted with respect to said first type of conductivity; and a gate electrode disposed above the first and second channel regions and located to enable control of the first and second channel regions, wherein said first and second channel regions in combination define a first threshold voltage of the semiconductor device for transitioning a total conductivity of the first and second channel regions into a low impedance state and a second threshold voltage of the semiconductor device that results in an abrupt conductivity change of the total conductivity of said first and second channel regions when said total conductivity is in the low impedance state.

* * * * *